(12) United States Patent
Choi

(10) Patent No.: US 7,115,441 B2
(45) Date of Patent: Oct. 3, 2006

(54) SEMICONDUCTOR PACKAGE WITH SEMICONDUCTOR CHIPS STACKED THEREIN AND METHOD OF MAKING THE PACKAGE

(75) Inventor: Ill Heung Choi, Cheonan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/864,508

(22) Filed: Jun. 10, 2004

(65) Prior Publication Data
US 2004/0241908 A1 Dec. 2, 2004

Related U.S. Application Data

(62) Division of application No. 10/157,361, filed on May 28, 2002, now Pat. No. 6,781,240.

(30) Foreign Application Priority Data
Jun. 26, 2001 (KR) ................................ 2001-36550

(51) Int. Cl.
*H01L 21/48* (2006.01)
*H01L 21/50* (2006.01)
(52) U.S. Cl. ...................................... 438/109; 438/127
(58) Field of Classification Search ................ 438/106, 438/108, 109, 126, 107, 118, 125, 127
See application file for complete search history.

(56) References Cited

U.S. PATENT DOCUMENTS

| | | | | |
|---|---|---|---|---|
| 5,534,127 | A * | 7/1996 | Sakai | ............ 205/125 |
| 5,808,360 | A | 9/1998 | Akram | |
| 5,923,090 | A * | 7/1999 | Fallon et al. | ............ 257/777 |
| 6,057,598 | A | 5/2000 | Payne et al. | |
| 6,133,637 | A * | 10/2000 | Hikita et al. | ............ 257/777 |
| 6,175,157 | B1 * | 1/2001 | Morifuji | ............ 257/777 |
| 6,274,929 | B1 * | 8/2001 | Leong et al. | ............ 257/724 |
| 6,376,914 | B1 | 4/2002 | Kovats et al. | |
| 6,380,615 | B1 * | 4/2002 | Park et al. | ............ 257/686 |
| 6,420,787 | B1 * | 7/2002 | Kobayashi et al. | ............ 257/777 |
| 6,462,420 | B1 * | 10/2002 | Hikita et al. | ............ 257/777 |
| 6,548,326 | B1 | 4/2003 | Kobayashi et al. | |
| 6,558,977 | B1 * | 5/2003 | Nakaoka et al. | ............ 438/107 |
| 6,611,052 | B1 * | 8/2003 | Poo et al. | ............ 257/686 |

(Continued)

FOREIGN PATENT DOCUMENTS

KR  2002-0081794  10/2002

*Primary Examiner*—Scott B. Geyer
(74) *Attorney, Agent, or Firm*—Harness, Dickey & Pierce, P.L.C.

(57) ABSTRACT

A method of manufacturing a semiconductor package, including: preparing a first semiconductor chip, where a plurality of first central electrode pads are formed along a center of an active surface of the first semiconductor chip, preparing a second semiconductor chip, where a plurality of second central electrode pads are formed along a center region of an active surface of the second semiconductor chip, and a plurality of edge electrode pads are formed along an edge of the second semiconductor chip, attaching the second semiconductor chip to a substrate, connecting electrically the edge electrode pads of the second semiconductor chip to the substrate, encapsulating the connection between the edge electrode pads and the substrate, forming a plurality of metal bumps on the central electrode pads of the second semiconductor chip, and stacking the first semiconductor chip on the second semiconductor chip so that the first central electrode pads of the first semiconductor chip attach to the respective second central electrode pads of the second semiconductor chip via the metal bumps.

8 Claims, 3 Drawing Sheets

U.S. PATENT DOCUMENTS 6,798,070 B1 * 9/2004 Funaya et al. .............. 257/777
2003/0042589 A1 * 3/2003 Hong ......................... 257/686
2004/0012080 A1 * 1/2004 Hedler et al. ............... 257/678
2004/0251529 A1 * 12/2004 Lee et al. ................... 257/686

* cited by examiner

SEMICONDUCTOR PACKAGE WITH SEMICONDUCTOR CHIPS STACKED THEREIN AND METHOD OF MAKING THE PACKAGE

This application is a divisional application of application Ser. No. 10/157,361, filed on May 28, 2002, issued as U.S. Pat. No. 6,781,240 B2 on Aug. 24, 2004.

BACKGROUND OF THE INVENTION

1. Field of the Invention

The present invention relates to a semiconductor chip package, and more particularly to a package with multiple stacked semiconductor chips and a manufacturing method of the package.

2. Description of the Related Art

As higher performance and integrated improvement of a semiconductor device are required, the size of the semiconductor chips increases, and higher surface-mounting density of a semiconductor device is demanded. A semiconductor package including a number of semiconductor chips inside, which is called a chip-stack package, can satisfy such demand. For example, semiconductor chips can be stacked in the package. Alternatively, a number of packages, each of which includes a single chip, can be stacked to increase the surface-mounting density.

The stacking of the packages may cause the increased height of the stacked packages. Further, for interconnecting the external leads (or terminals) of the packages often requires customized shaping of the leads, which is an additional process. For instance, such additional process may include reforming of the leads so that the leads of a upper package can contact the leads of a lower package, or connecting the leads using additional pins. In addition, the additional stacking process may reduce the yield of the stacked device.

However, the chip-stack package can be effective than the stacked packages in accomplishing the reduction of the total height of the stacked semiconductor chips. FIG. 1 shows a conventional chip-stack package 10. A lower semiconductor chip 13 is attached to the lower surface of a lead frame die pad 11 via an adhesive 12, and an upper semiconductor chip 15 is attached to the upper surface of the die pad 11 via an adhesive 14. The active surface of the lower chip 13 faces downward, and the active surface of the upper chip 15 faces upward. Bonding pads (or electrode pads) 2 of the upper and lower semiconductor chips 13 and 15 are electrically connected to leads (or external terminals) 16 via bonding wires 17 and 18, respectively. The upper and lower semiconductor chips 13 and 15 and the bonding wires 17 and 18 are encapsulated by a package body 19 formed of a molding compound. In the package 10, the upper and lower semiconductor chips 13 and 15 are mirror chips to each other, and bonding pads 2 are formed along the edges of the chips 13 and 15.

FIG. 2 shows another known chip-stack package 20, in which the active surfaces of chips 23 and 25 face toward the same direction. Chip 23 is attached via an adhesive 22 on a die pad 21, and chip 25 is attached via an adhesive 24 on the active surface of the chip 23. The lower chip 23 is larger than the upper chip 25. Bonding pads 2 of the upper and lower chips 23 and 25 are electrically connected to leads 26 via bonding wires 27 and 28, and are protected by a package body 29. The upper and lower chips 23 and 25 may be different from each other, and bonding pads 2 are formed along the edges of the chips 23 and 25.

FIG. 3 shows still another known chip-stack package 30. A lower chip 33, on which bonding pads 2 are formed along the edges, is attached to the lower surface of a lead frame 31 via an adhesive 32, and an upper chip 35, on which bonding pads 2 are formed along the center line, is attached to the upper surface of the lead frame 31 via an adhesive 34. For electrical connection of the central pad chip 35, an opening is formed in the central portion of the lead frame 31. The edge pad chip 33 and the central pad chip 35 are electrically connected to the lead frame 31 via bonding wires 37 and 38, respectively. The end portions of the lead frames are exposed through the lower surface of a package body 39, and the end portions are connected to land type connections 36.

In memory chips, use of the central-pad chips is preferred because a signal skew for a number of memory shell blocks can be decreased when the bonding pads are formed along the center line of the semiconductor chip. Further, as memory capacity and speed of the memory chips increase, the central-pad memory chips are preferred to the edge-pad chips. Accordingly, technology for stacking a number of central-pad memory chips is in demand.

SUMMARY OF THE INVENTION

In accordance with an embodiment of the present invention, a semiconductor package includes a first semiconductor chip, a second semiconductor chip, a substrate, and metal bumps. The first semiconductor chip has first central electrode pads disposed along a center of an active surface of the first semiconductor chip. The second semiconductor chip has second central electrode pads disposed along a center of an active surface of the second semiconductor chip and edge electrode pads disposed along an edge of the active surface of the second semiconductor chip. The metal bumps connect the first central electrode pads of the first semiconductor chip to the second central electrode pads of the second semiconductor chip. The second semiconductor chip is mounted on the substrate, and the edge pads of the second semiconductor chip are electrically connected to the substrate.

The second semiconductor chip includes a sawing region where the edge electrode pads are formed, and the edge electrode pads of the second semiconductor chip are connected to the substrate via bonding wires. The bonding wires are encapsulated by an encapsulant. External terminals are formed on the substrate so that the external terminals are electrically connected to the edge electrode pads of the second semiconductor chip.

In accordance with another embodiment of the present invention, a method of manufacturing a semiconductor package includes: preparing a first semiconductor chip having first central electrode pads; preparing a second semiconductor chip having second central electrode pads and edge electrode pads; attaching the second semiconductor chip to a substrate; connecting electrically the edge electrode pads of the second semiconductor chip to the substrate; encapsulating the connection between the edge electrode pads and the substrate; forming metal bumps on the central electrode pads of the second semiconductor chip; and stacking the first semiconductor chip on the second semiconductor chip so that the first central electrode pads of the first semiconductor chip attach to the respective second central electrode pads of the second semiconductor chip via the metal bumps.

The method further includes forming a package body which encapsulates the first semiconductor chip and the second semiconductor chip, and forming external terminals on the substrate. The central electrode pads of the second semiconductor chip are electrically connected to the edge electrode pads.

BRIEF DESCRIPTION OF THE INVENTION

The use of the same reference symbol in different drawings indicates similar or identical items.

DETAILED DESCRIPTION OF PREFERRED EMBODIMENTS

Figure 1:
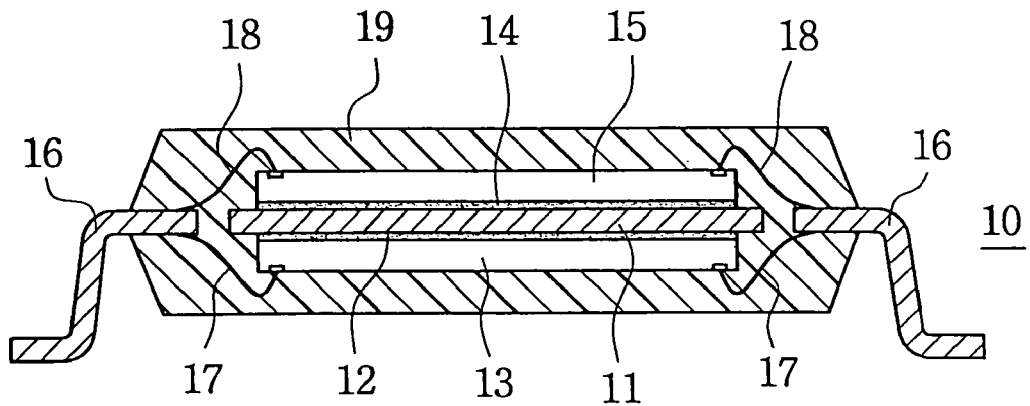
FIG. 1 is a cross-sectional view of a conventional chip-stack package.
Figure 2:
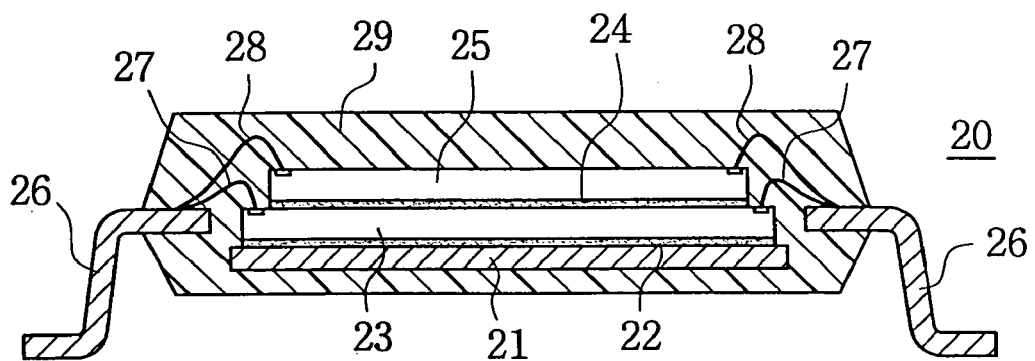
FIG. 2 is a cross-sectional view of another conventional chip-stack package.
Figure 3:
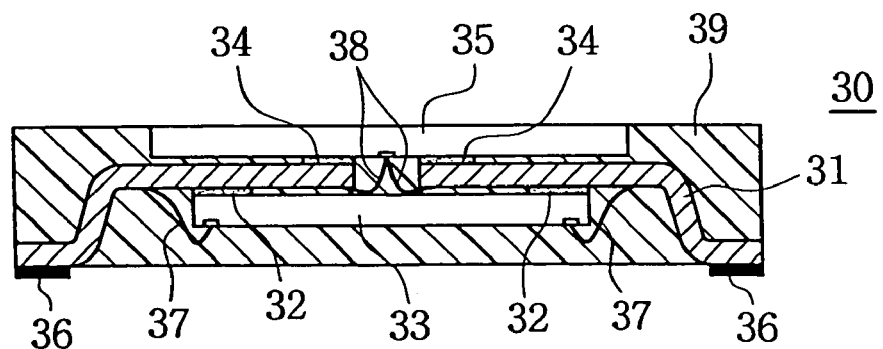
FIG. 3 is a cross-sectional view of still another conventional chip-stack package.
Figure 4:
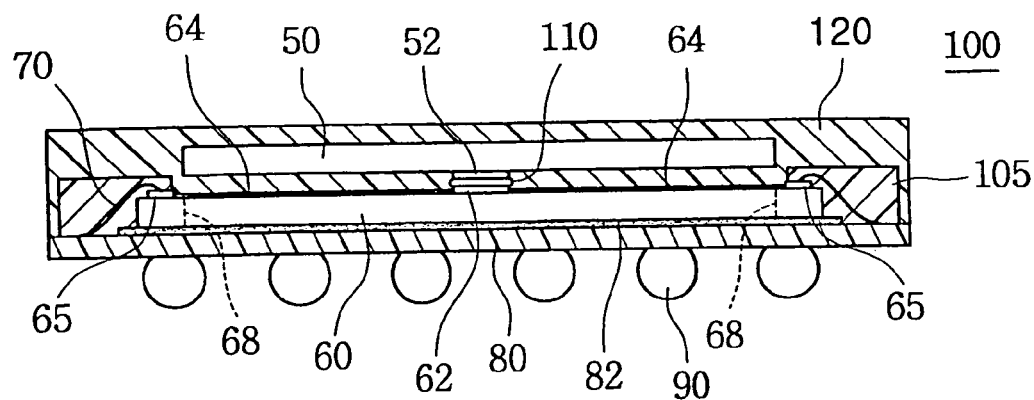
FIG. 4 is a cross-sectional view of a chip-stack package according to an embodiment of the present invention.

Referring to FIG. 4, a chip-stack package 100, according to an embodiment of the present invention, is described. The chip-stack package 100 includes an upper chip 50 and a lower chip 60. The upper and lower chips 50, 60 are of central pad type where electrode pads 52, 62 are disposed along the center of the active surfaces. The lower chip 60 includes edge electrode pads 65 as well as the central electrode pad 62, and the edge electrode pads 65 are disposed on the outside of scribe lines 68. The edge electrode pads 65 are connected to bonding pads (not shown) on a substrate 80 via bonding wires 70.

The lower semiconductor chip 60 is attached to the substrate 80 via an adhesive 82. The substrate 80 may be a printed circuit board (PCB) including a circuit layer (not shown) and an insulating layer (not shown). Solder balls 90 formed on the lower surface of the substrate 80 are electrically connected to the bonding pads of the substrate 80 through the circuit layer of the substrate 80. Therefore, the lower chip 60 is electrically connected to the solder balls 90, and the upper chip 50 which is connected to the lower chip 60 is also electrically connected to the solder balls 90. Alternatively, other electrically conductive components such as solder columns may replace the solder balls 90 as external connection pins of the package 100.

The upper chip 50 and the lower chip 60 are electrically and mechanically connected by connecting the central pads 52 of the upper chip 50 and the central pads 62 of the lower chip 60 through metal bumps 110.

The edge electrode pads 65 of the lower chip 60 and the bonding wires 70 are protected by a sealing resin 105, and the upper and lower chips 50, 60 are protected by the package body 120.

Next, referring to FIGS. 5 to 8, a method of manufacturing a chip-stack package device according to the invention is described.

Figure 5A:
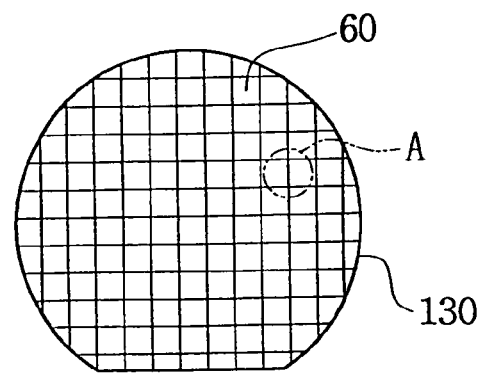
FIGS. 5a and 5b are plain views of a wafer and a partially enlarged view of the wafer according to an embodiment of the invention.
Figure 5B:
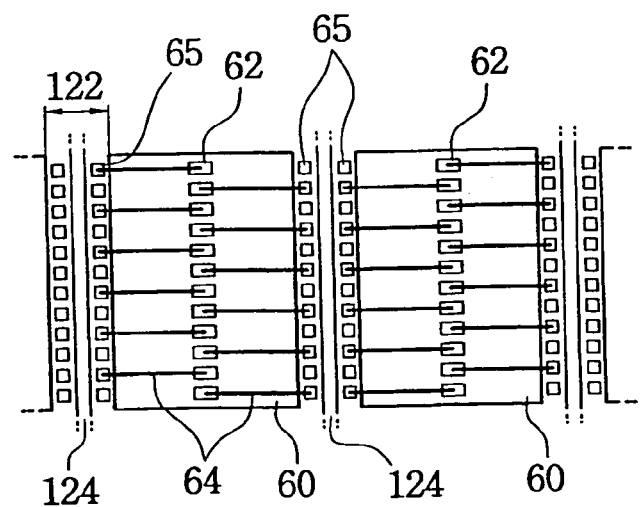

First, a semiconductor wafer 130, which includes a number of semiconductor chips, is prepared. In FIGS. 5a and 5b, only the wafer, on which the lower chip 60 is formed, is shown for the convenience of explanation, but the wafer having the upper chip 50 (not shown) is same as the wafer of the conventional central pad chip, which is widely used.

FIG. 5b, which is an enlarged view of a circle A of the wafer 130 shown in FIG. 5a, shows two semiconductor chips 60 and sawing regions 122 between the two chips 60. The central pads 62 of each of the lower chips 60 are disposed on the corresponding position to the central pads 52 of the upper chip 50 (FIG. 4). The lower chip 60 includes the edge electrode pads 65 formed in the sawing regions 122. The central pads 52 are electrically connected to the corresponding edge electrode pads 65 via metal wires 64. The metal wires 64 can be fabricated by a conventional metal layer patterning method. In general, patterns for testing characteristics of the semiconductor chips in a wafer level are formed in the sawing regions 122, and the test patterns are broken in a step, where the wafer is sawed and separated into individual chips. However, in the present invention, the sawing step must be carried out so as not to damage the edge pads 65 formed in the sawing regions 122 and the metal wires 64 by which the edge pads 65 and the central pad 52 are connected. The typical width of the sawing regions on a semiconductor wafer is 110 μm or 220 μm. In the present invention, it is preferred to use the sawing regions of larger width and to use a thin cutting blade. The typical size of the edge pads 65 are 70 μm×70 μm.

Figure 6:
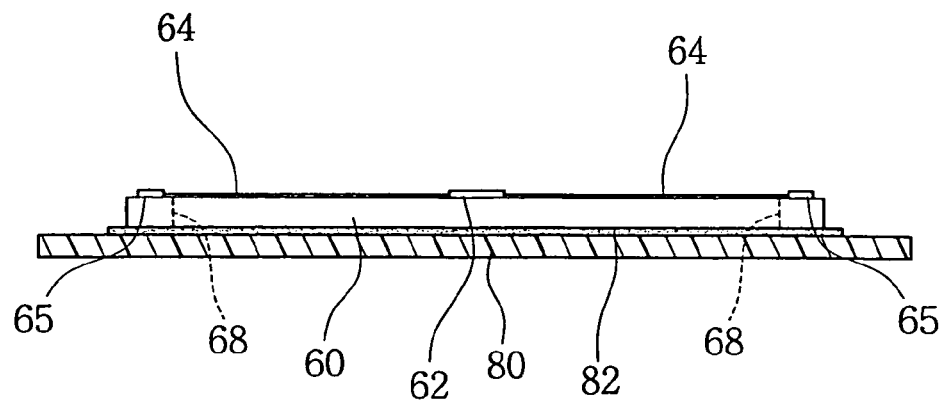
FIG. 6 is a cross-sectional view for illustrating the first die-attachment step for attaching the lower semiconductor chip to the substrate in the chip-stack package of FIG. 4.

When the lower chip 60 is prepared, as shown in FIG. 6, a first die-bonding step is carried out by attaching the chip 60 to the substrate 80 using an adhesive 82 and then hardening the adhesive 82. At this time, the active surface of the lower chip 60 faces toward the upper direction of the drawing.

Figure 7:
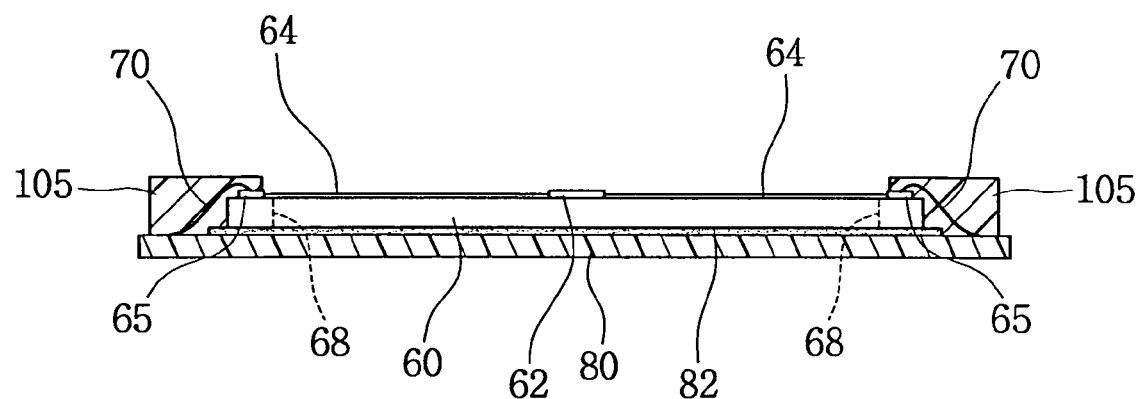
FIG. 7 is a cross-sectional view for illustrating a step for connecting the lower semiconductor chip to the substrate via bonding wires in the chip-stack package of FIG. 4.

Next, as shown in FIG. 7, the edge electrode pads 65 of the lower chip 60 are electrically connected to the substrate 80 via the bonding wires 70. In the following step, a protective body 105 is formed by an encapsulant in order to protect bonding wires 70 from damaging.

Figure 8:
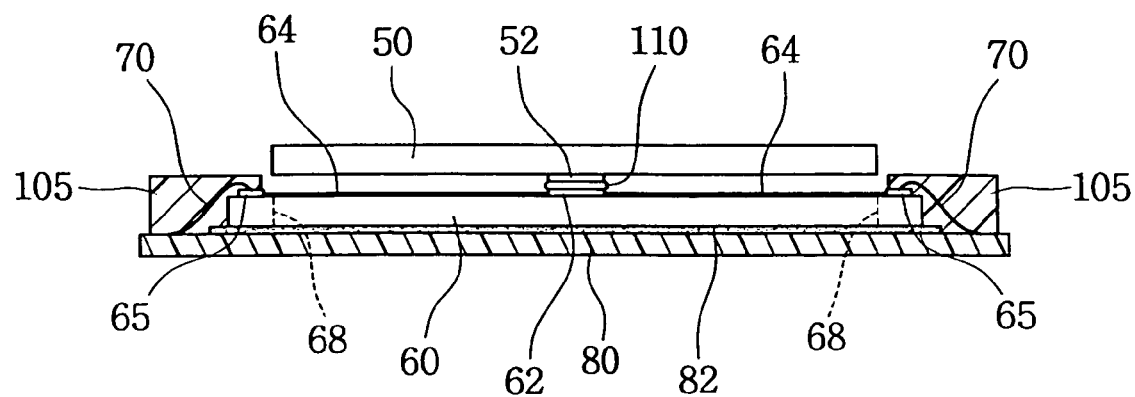
FIG. 8 is a cross-sectional view for explaining a process for stacking the upper semiconductor chip and the lower semiconductor chip through the central pads in the chip-stack package of FIG. 4.

Next, as shown in FIG. 8, the metal bumps 110 are formed on the central electrode pad 62 of the lower chip 60. The metal bumps 110 can be formed using a screen-printing or a solder bumping, which is widely used in manufacturing a flip-chip. For attaching the upper chip 50 to the lower chip 60, the upper chip 50 is aligned on the lower chip 60 so that the active surface of the upper chip 50 faces downward. The central pads 52 of the upper chip 50 are attached to the corresponding metal bumps 110. Thus, the upper and lower chips 50, 60 are electrically connected to each other.

Next, the package body 120 protecting the upper and lower chips 50, 60 is formed, for example, by a known transfer-molding method, and external terminals such as the solder ball 90 are formed on the lower surface of the substrate 80.

The invention has been described using exemplary embodiments. However, it is to be understood that the scope of the invention is not limited to the disclosed embodiments. On the contrary, it is intended to cover various modifications and similar arrangements. The scope of the claims, therefore, should be accorded to the broadest interpretation so as to encompass all such modifications and similar arrangements.

What is claimed is:

1. A method of manufacturing a semiconductor package, comprising:

preparing a first semiconductor chip, wherein a plurality of first central electrode pads are formed along a center of an active surface of the first semiconductor chip;

preparing a second semiconductor chip, wherein a plurality of second central electrode pads are formed along a center region of an active surface of the second semiconductor chip, and a plurality of edge electrode pads are formed along an edge of the second semiconductor chip;

attaching the second semiconductor chip to a substrate;

connecting electrically the edge electrode pads of the second semiconductor chip to the substrate;

providing an encapsulant to form a protective structure that encapsulates the connection between the edge electrode pads and a portion of the substrate;

forming a plurality of metal bumps on the central electrode pads of the second semiconductor chip;

stacking the first semiconductor chip on the second semiconductor chip so that the first central electrode pads of the first semiconductor chip attach to the respective second central electrode pads of the second semiconductor chip via the metal bumps; and forming a package body to encapsulate the first semiconductor chip, the second semiconductor chip, and the encapsulant.

2. A method of manufacturing a semiconductor package according to claim 1, further comprising forming a plurality of external terminals on the substrate.

3. The method of manufacturing a semiconductor package according to claim 1, wherein electrically connecting the second semiconductor chip to the substrate is accomplished by wire-bonding.

4. The method of manufacturing a semiconductor package according to claim 1, wherein forming the metal bumps is carried out by screen-printing.

5. The method of manufacturing a semiconductor package according to claim 1, wherein the central electrode pads of the second semiconductor chip are electrically connected to the edge electrode pads.

6. The method of manufacturing a semiconductor package according to claim 1, further comprising electrically connecting at least one of the plurality of edge electrode pads to at least one of the plurality of second central electrode pads.

7. The method of manufacturing a semiconductor package according to claim 6, wherein electrically connecting the edge electrode pads to the second central electrode pads via metal wires.

8. The method of manufacturing a semiconductor package according to claim 6, wherein the plurality of second central electrode pads are formed substantially parallel with the plurality of edge electrode pads.

* * * * *